United States Patent [19]
Krautschneider et al.

[11] Patent Number: 5,959,328
[45] Date of Patent: *Sep. 28, 1999

[54] ELECTRICALLY PROGRAMMABLE MEMORY CELL ARRANGEMENT AND METHOD FOR ITS MANUFACTURE

[75] Inventors: Wolfgang Krautschneider, Hohenthann; Lothar Risch, Neubiberg; Franz Hofmann, Munich; Hans Reisinger, Gruenwald, all of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/779,446

[22] Filed: Jan. 7, 1997

[30] Foreign Application Priority Data

Jan. 8, 1996 [DE] Germany .................... 196 00 422

[51] Int. Cl.$^6$ .................................................. H01L 29/76
[52] U.S. Cl. ......................... 257/314; 257/315; 257/316
[58] Field of Search ................... 257/314, 315, 257/316, 311, 622, 330, 332

[56] References Cited

U.S. PATENT DOCUMENTS

| | | | |
|---|---|---|---|
| 4,047,974 | 9/1977 | Harari | 257/324 |
| 4,606,011 | 8/1986 | Wada et al. | 257/622 |
| 4,814,840 | 3/1989 | Kameda | 257/316 |
| 5,306,941 | 4/1994 | Yoshida | 257/390 |
| 5,424,569 | 6/1995 | Prall | 257/324 |
| 5,467,308 | 11/1995 | Change et al. | 257/314 |
| 5,608,250 | 3/1997 | Kalnitsky | 257/314 |
| 5,610,419 | 3/1997 | Tanaka | 257/314 |

FOREIGN PATENT DOCUMENTS 0 673 070 A2  9/1995  European Pat. Off. .
30 32 364 A1  4/1982  Germany .

OTHER PUBLICATIONS

IEEE Journal of Solid–State Circuits, vol. 26, No. 4, 1991, pp. 497–501, Nozaki et al.
IEDM 1992, pp. 469–472–Hori et al.
Patent Abstracts of Japan, JP5–326 976, E–1521, Mar. 10, 1994, vol. 18/ No. 144.
IEEE Journal of Solid–State Circuits, vol. SC–11, No. 3, Jun. 1976– Kawagoe et al.
S.M. Sze, Semiconductor Devices, John Wiley, pp. 468–490.

*Primary Examiner*—Olik Chaudhuri
*Assistant Examiner*—Phat X. Cao
*Attorney, Agent, or Firm*—Hill & Simpson

[57] ABSTRACT

An electrically programmable memory cell arrangement has a plurality of individual memory cells that respectively has an MOS transistor with a gate dielectric with traps, and which are arranged in rows that run in parallel. Adjacent rows thereby respectively run in alternating fashion on the bottom of the longitudinal trenches (5) and between adjacent longitudinal trenches (5) and are insulated against one another. The memory cell arrangement can be manufactured by means of self-adjusting process steps with a surface requirement per memory cell of 2 $F^2$ (F: minimum structural size).

11 Claims, 2 Drawing Sheets

5,959,328

ELECTRICALLY PROGRAMMABLE MEMORY CELL ARRANGEMENT AND METHOD FOR ITS MANUFACTURE

BACKGROUND OF THE INVENTION

Many electronic systems require memories in which the data are fixedly written. Memories of this sort are designated, among other designations, as fixed-value memories, read memories or read-only memory.

For very large quantities of data, plastic disks coated with aluminum are often used as read memories. In the coating, these plastic disks have two types of punctiform recesses, allocated the logical values zero and one, The information is digitally stored in the arrangement of these recesses. Disks of this sort are called compact disks and are distributed for the digital storage of music.

To read the data stored on a compact disk, a reading device is used in which the disk rotates mechanically. The punctiform recesses are scanned via a laser diode and a photo cell. Typical scan rates are thereby 2×40 kHz. Five gigabits of information can be stored on a compact disc.

The reading device has moving parts that are subject to mechanical wear, require a relatively large volume and permit only a slow access to data. In addition, the reading device is sensitive to vibration, and its usability in mobile systems is thus limited.

For storing smaller amounts of data, fixed-value memories based on semiconductors are known. These are often realized as planar integrated silicon circuits in which MOS transistors are used. The MOS transistors are respectively selected via the gate electrode connected with the wordline. The input of the MOS transistor is connected with a reference line, the output with a bitline. During the read process, it is evaluated whether or not a current is flowing through the transistor. The stored information is allocated correspondingly. Technologically, the storing of the information is mostly effected in that the MOS transistors have different operating voltages due to different implantation in the channel region.

These semiconductor-based memories allow freely selectable access to the stored information. The electrical power required for the reading of the information is significantly lower than in a reading device with a mechanical drive. Since no mechanical drive is required to read the information, the mechanical wear is omitted, as is sensitivity to vibration. Semiconductor-based fixed-value memories are thus also usable for mobile systems.

The specified silicon memories have a planar construction. A minimal surface requirement is thus necessary per memory cell, about 6 to 8 $F^2$, where F is the smallest structural size that can be produced in the respective technology. In a 1 $\mu$m technology, planar silicon memories are thereby limited to storage densities of about 0.14 bit per $\mu m^2$.

In planar silicon memories, it is known to increase the storage density by arranging the MOS transistors in rows. In each row, the MOS transistors are connected in series. The MOS transistors are read out by means of row-by-row driving in the sense of an NAND architecture. For this purpose, only two terminals are required per row, between which the MOS transistors arranged in the row are connected in series. Source/drain regions, connected with each other, of adjacent MOS transistors can then be realized as a continuous doped region. In this way, the surface requirement per memory cell can theoretically be reduced to 4 $F^2$ (F: the smallest structural size manufacturable in the respective technology). A memory cell arrangement of this sort is known, e.g. from H. Kawagoe and N. Tsuji in IEEE J. Solid-State Circuits, vol. SC-11, p. 360, 1976.

The programming of the specified memory cell arrangements ensues during manufacture. However, many applications require memory into which the data can be written by electrical programming. In electrically programmable memory cell arrangements, the storing of the information is mostly effected in that a floating gate is provided between the gate and the channel region of the MOS transistors, which gate can be charged with an electrical charge, or, as gate dielectric, a double layer of $SiO_2$ and $Si_3N_4$ is provided, on whose boundary surface electrical charge bearers can be held at traps. The operating voltage of the MOS transistor is dependent on the charge located at the floating gate or, respectively, the traps. This characteristic is used for electrical programming (see e.g. S.M. Sze, Semiconductor Devices, John Wiley, p. 486–490).

SUMMARY OF THE INVENTION

It is an object of the present invention to provide an electrically programmable memory cell arrangement on a semiconductor basis in which an increased storage density is achieved and which can be manufactured with few manufacturing steps and a high yield. In addition, it is an object of the present invention to provide a method for manufacturing such a memory cell arrangement.

In the inventive memory cell arrangement, memory cells are respectively arranged in rows that run essentially in parallel in a main surface of a semiconductor substrate. Longitudinal trenches are provided in the main surface of the semiconductor substrate. The longitudinal trenches run essentially parallel to the rows. They are at least as long as the rows. The rows are arranged so as to alternate respectively between adjacent longitudinal trenches and are arranged on the bottom of the longitudinal trenches. The main surface of the semiconductor substrate is structured by the longitudinal trenches. Every second row is arranged on the bottom of the longitudinal trenches; the rows arranged between these are arranged on the material bordering on the longitudinal trenches.

The MOS transistors have a gate dielectric made of a material with traps. Traps have the characteristic of catching charge bearers, specifically electrons. For electrical programming, the MOS transistors are connected in such a way that charge bearers corresponding to the information to be stored flow into the gate dielectric and are held there by the traps. Since the charge bearers are caught in the traps, the information is permanently stored. The programmed memory cell arrangement thus represents a fixed-value memory cell arrangement. The programming can ensue by means of Fowler-Nordheim tunneling or also by means of hot electron injection. Through reversal of the polarities in Fowler-Nordheim tunneling, charge bearers can be removed from the traps, so that the programming of the memory cell arrangement is altered.

For the storage of data in digital form, the MOS transistors are programmed in such a way that they comprise two different threshold voltages. If the memory cell arrangement is to be used for many-valued logic, the gate dielectric is charged during programming, through corresponding voltage and time conditions, with different charge quantities in such a way that the MOS transistors comprise more than two different threshold voltages, according to the information stored.

According to an embodiment of the invention, the gate dielectric is fashioned as a multiple layer in which at least one layer is provided that has an increased charge bearer capture cross-section in comparison with at least one additional layer in the multiple layer. The traps are localized at the boundary between both layers. The dielectric multiple layer preferably comprises an $SiO_2$ layer, an $Si_3N_4$ layer and an $SiO_2$ layer (known as ONO). Alternatively, the gate dielectric, as a multiple layer, can be made of other materials, whereby the layer with the increased charge bearer capture cross-section is made for example of $Si_3N_4$, $Ta_2O_5$, $Al_2O_3$ or of $TiO_2$, and the adjacent layer is made of $SiO_2$, $Si_3N_4$ or $Al_2O_3$. In addition, the multiple layer can comprise more or fewer than three layers.

Alternatively, the gate dielectric can have a dielectric layer, e.g. made of $SiO_2$, in which are stored foreign atoms, e.g. W, Pt, Cr, Ni, Pd or Ir. The stored foreign atoms can be attached through implantation, through addition during oxidation, or through diffusion. The stored foreign atoms form the traps in this case.

Adjacent rows are insulated against one another by means of an insulating structure. The insulating structure insulates adjacent rows in the vertical direction. It is within the scope of the invention to form the insulating structure by means of insulating spacers arranged along the side walls of the longitudinal trenches, and by means of doped layers respectively arranged between adjacent longitudinal trenches in the semiconductor substrate, which prevent the formation of conductive channels in the semiconductor substrate between adjacent rows, and are known as channel stop layers.

The doped layers are preferably formed in the material of the semiconductor substrate, which is respectively arranged between adjacent longitudinal trenches, and comprise a depth in the semiconductor substrate that is smaller than the depth of the longitudinal trenches. This insulation requires no surface between adjacent rows. Parallel to the main surface of the semiconductor substrate, adjacent rows adjoin one another immediately. Perpendicular to the main surface of the semiconductor substrate, adjacent rows comprise a spacing corresponding to the depth of the longitudinal trenches.

The MOS transistors of memory cells arranged along a row are preferably connected in series. Source/drain regions, connected with one another, of MOS transistors adjacent along a row are thereby fashioned as a continuous doped region. Each row comprises two terminals, between which MOS transistors arranged in the row are connected in series. Via these terminals, the MOS transistors located in the respective row can be driven in the sense of a NAND architecture.

The inventive memory cell arrangement is preferably surrounded by an insulating structure comprising insulating spacers and doped layers that prevent the formation of conductive channels in the semiconductor substrate between adjacent rows, as well as with MOS transistors connected in series in each row, in which source/drain regions respectively connected with one another are fashioned as a continuous doped region in the semiconductor substrate. If in this embodiment the breadth of the longitudinal trenches, the spacing of adjacent longitudinal trenches, the extension of the continuous doped regions and the breadth of the wordlines are fashioned corresponding to a minimum structure size (in the respective technology) F, then the surface requirement per memory cell is 2 F . On the basis of a technology with a minimum structural width F of 0.4 $\mu$m, a storage density of 6.25 bits/$\mu m^2$ can thereby be achieved.

The manufacture of the inventive memory cell arrangement ensues using self-adjusting procedural steps, so that the space requirement per memory cell can be reduced.

For the manufacture of the memory cell arrangement, first longitudinal trenches that run essentially in parallel are etched. After the production of a gate dielectric from a material with traps for all MOS transistors, wordlines that run transversely to the rows are produced, which respectively form gate electrodes of MOS transistors arranged along different rows. Finally, a source/drain implantation is carried out in which the wordlines are used as masks, and in which are fashioned at the same time the source/drain regions for the MOS transistors arranged at the bottom of the longitudinal trenches and for the MOS transistors that are arranged between adjacent longitudinal trenches.

The longitudinal trenches are preferably etched using a trench mask containing $SiO_2$ as an etching mask.

According to an embodiment of the invention, the gate dielectric is fashioned as a multiple layer with at least one layer that comprises an increased charge bearer capture cross-section in comparison with at least one additional layer. Alternatively, the gate dielectric is fashioned as a dielectric layer with stored foreign atoms, whereby the stored foreign atoms comprise an increased charge bearer capture cross-section in comparison with the dielectric layer.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

For the manufacture of an inventive memory cell arrangement in a substrate 1 from, e.g. monocrystalline silicon, first an insulating structure is produced on a main surface 2 of the substrate 1, which defines the region for the memory cell arrangement (not shown). The substrate 1 is for example p-doped with a doping material concentration of $10^{15}$ $cm^{-3}$.

Figure 1:
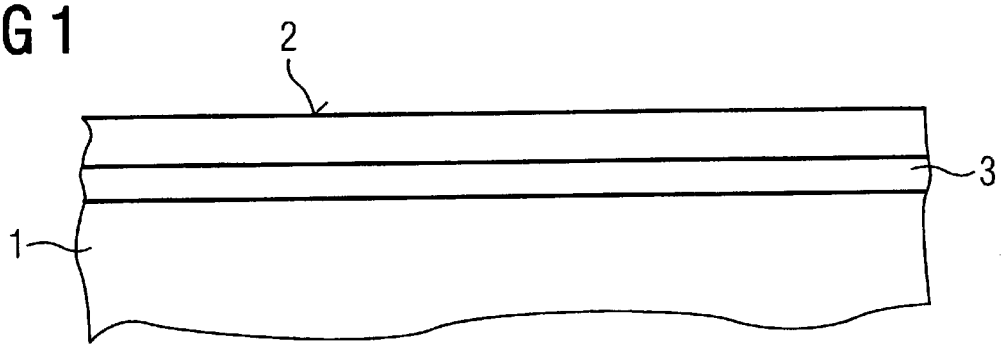
FIG. 1 shows a silicon substrate after the formation of a channel stop layer.

An implantation with boron is subsequently carried out for the formation of a channel stop layer 3. The boron implantation ensues with a dose of for example $6\times10^{13}$ $cm^{-2}$ and an energy of for example 120 keV. By this means, the channel stop layer 3 is manufactured with a depth of for example 0.2 $\mu$m underneath the main surface 2 with a thickness of 0.3 $\mu$m (see FIG. 1). A first channel implantation is carried out with for example $1.5\times10^{12}$ $cm^{-2}$ at 25 keV, for the setting of the operating voltages of MOS transistors to be manufactured on the main surface.

Figure 2:
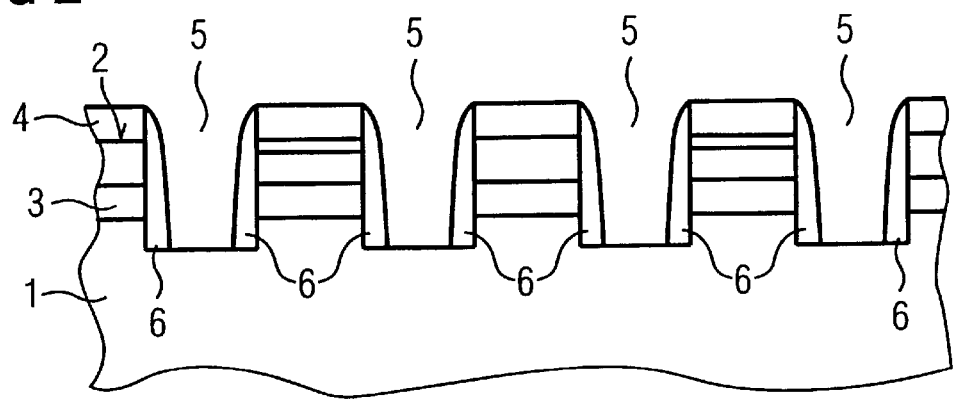
FIG. 2 shows the silicon substrate after the etching of a trench.

After the depositing of an $SiO_2$ layer with a thickness of, e.g. 200 nm, using a TEOS method, a trench mask 4 is fashioned through the structuring of the $SiO_2$ layer using a photolithographic method (see FIG. 2).

By means of anisotropic etching, e.g. with $Cl_2$, longitudinal trenches 5 are etched using the trench mask 4 as an etching mask. The longitudinal trenches 5 comprise a depth of, e.g. 0.6 μm. The longitudinal trenches 5 extend into the substrate 1, running through the channel stop layer 3.

The width of the longitudinal trenches 5 is 0.4 pm in a 0.4-μm technology; the spacing of adjacent longitudinal channels 5 is likewise 0.4 μm. The length of the longitudinal trenches 5 is oriented according to the size of the memory cell arrangement and is for example 130 μm.

There follows a second channel implantation, with for example $1.5 \times 10^{12}$ $cm^{-2}$ at 25 keV, for the setting of the operating voltage of MOS transistors to be manufactured at the bottom of the longitudinal trenches.

Through the depositing of an additional $SiO_2$ layer in a TEOS method, and subsequent anisotropic etching, spacers 6 made of $SiO_2$ are fashioned on the side walls of the longitudinal trenches 5.

Subsequently, the trench masks 4 are wet-chemically removed, e.g. with $NH_4F/HF$. The spacers 6 are thereby also removed. After the growing and etching away of a sacrificial oxide, an additional $SiO_2$ layer is deposited in a TEOS method, from which spacers 8 made of $SiO_2$ are in turn fashioned on the side walls of the longitudinal trenches 5 by means of anisotropic dry etching. The $SiO_2$ layer is deposited with a thickness of e.g. 60 nm. The back-etching ensues for example with $CF_4$.

A gate dielectric 7 is subsequently formed. The gate dielectric 7 is formed from a material with high trap density for charge bearers injected into the dielectric. The gate dielectric 7 is for example formed from a dielectric multiple layer in which is provided at least one layer that comprises an increased charge bearer capture cross-section in comparison with at least one additional layer in the multiple layer. The dielectric multiple layer preferably comprises an $SiO_2$ layer, an $Si_3N_4$ layer and an $SiO_2$ layer (known as ONO). The layer thicknesses in the multiple layer are dimensioned in such a way that with respect to gate capacity the multiple layer corresponds to a layer of thermal $SiO_2$ with a thickness of, e.g. 10 nm. For this purpose, layer thicknesses of 4 nm are respectively required for the $SiO_2$ layers and a layer thickness of 5 nm is required for the $Si_3N_4$ layer.

Alternatively, as a multiple layer the gate dielectric 7 can be made of other materials, whereby the layer with the increased charge bearer capture cross-section is made for example from $SI_3N_4$, $Ta_2O_5$, $Al_2O_3$, or $TiO_2$, and the adjacent layer is made of $SiO_2$, $Si_3N_4$ or $Al_2O_3$. In addition, the gate dielectric 7 can comprise a dielectric layer, made e.g. of $SiO_2$, in which are stored foreign atoms, e.g. W, Pt, Cr, Ni, Pd or Ir. The stored foreign atoms can be brought in through implantation, through addition during an oxidation, or through diffusion.

Figure 3:
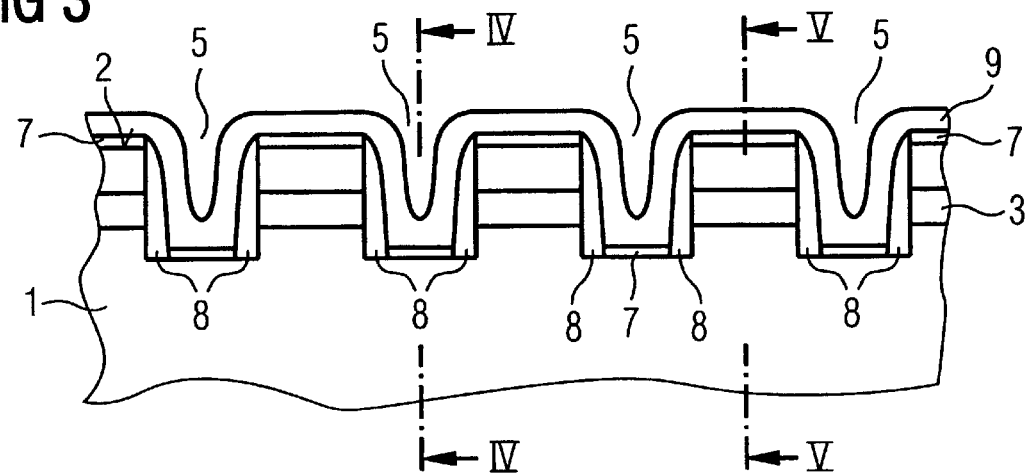
FIG. 3 shows the silicon substrate after the formation of wordlines.
Figure 4:
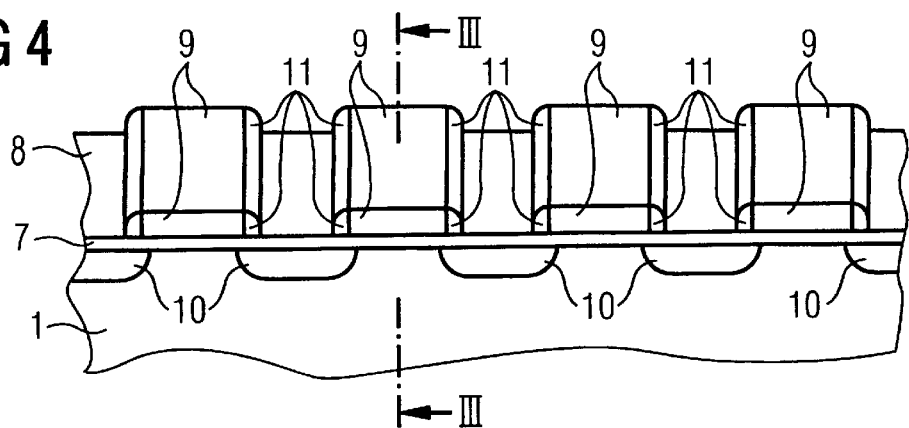
FIG. 4 shows the section through the silicon substrate designated IV—IV in FIG. 3.
Figure 5:
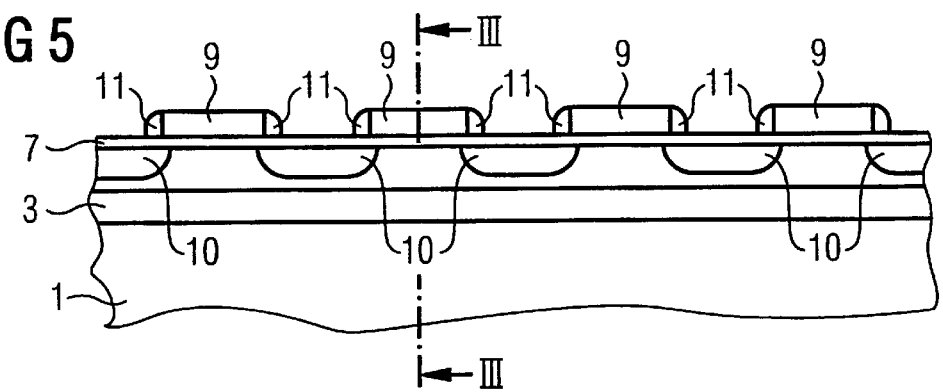
FIG. 5 shows the section through the silicon substrate designated V—V in FIG. 3.

The gate dielectric 7 is arranged on the bottom of the longitudinal trenches 5 and between the longitudinal trenches 5 on the main surface 2 (see FIG. 3, FIG. 4, which shows the section through FIG. 3 designated IV—IV, and FIG. 5, which shows the section in FIG. 3 designated V—V. The section shown in FIG. 3 is designated with III—III respectively in FIG. 4 and FIG. 5).

A polysilicon layer with a thickness of, e.g. 400 nm is deposited over the entire surface. By means of the structuring of the polysilicon layer in a photolithographic process step, wordlines 9 are formed that run along the main surface 2, e.g. perpendicular to the longitudinal trenches 5. The wordlines 9 comprise a width of 0.4 μm. Adjacent wordlines 9 comprise a spacing of 0.4 μm. The breadth and spacing of the wordlines 9 respectively corresponds to a minimum structural size F.

A source/drain implantation with e.g. arsenic is subsequently carried out at an energy of e.g. 25 keV and a dose of for example $5 \times 10^{15}$ $cm^{-2}$. During the source-drain implantation, doped regions 10 are produced at the bottom of the longitudinal trenches 5 as well as in the main surface 2 between the longitudinal trenches 5. The doped regions 10 respectively function as a common source/drain region for two adjacent MOS transistors arranged along a row. During the source/drain implantation, the wordlines 9 are doped at the same time.

Through depositing and anisotropic back-etching of an additional $SiO_2$ layer, the edges of the wordlines 9 are covered with spacers 11. The source-drain implantation ensues in a self-adjusted manner in relation to the wordlines 9. Corresponding to the spacing of adjacent wordlines 9, to the spacing of adjacent longitudinal trenches 5, as well as to the dimensions of the longitudinal trenches 5, the surface of the doped regions 10 parallel to the main surface 2 is maximally F×F, i.e. 0.4 μm×0.4 μm. Each two adjacent doped regions 10 and the wordline 9 arranged between them respectively form an MOS transistor. A row of MOS transistors connected in series, respectively formed from two doped regions 10 and the wordline 9 arranged between them, is respectively arranged on the bottom of the longitudinal trenches 5, as well as between the longitudinal trenches 5. The MOS transistors arranged at the bottom of a longitudinal trench 5 are insulated from the adjacent MOS transistors arranged between the longitudinal trenches 5 by means of the spacer 8 and the channel stop layer 3. The doping of the channel stop layer 3 of, e.g. $3 \times 10^{18}$ $cm^{-3}$ ensures in common with the spacers 8 that the threshold voltage of the parasitic MOS transistors formed at the edges of the longitudinal trenches 5 is sufficiently high to prevent a leak current.

Each row is provided with two terminals T at the edge of the memory cell arrangement, between which the MOS transistors arranged in the row are connected in series (not shown).

Figure 6:
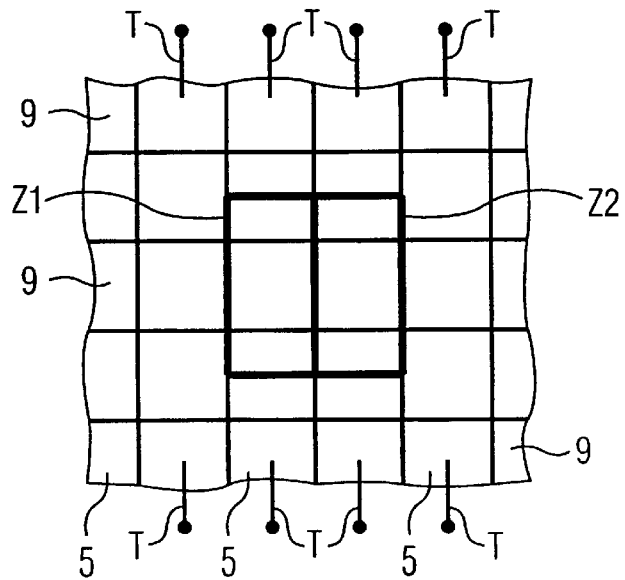
FIG. 6 shows a top view of the silicon substrate shown in FIG. 3.

If it is taken into account that each of the doped regions 10 is a source/drain region for two bordering MOS transistors, the length of each MOS transistor parallel to the run of the longitudinal trenches 5 is 2F. The breadth of the MOS transistors is respectively F. Thus, conditioned by the manufacturing, the surface for a memory cell formed from an MOS transistor is 2 $F^2$. Adjacent memory cells along a wordline 9, the contours Z1, Z2 of which cells are shown in bold lines in the view in FIG. 6, border immediately on one another in the projection on the main surface 2. The memory cell Z1 is arranged on the bottom of one of the longitudinal trenches 5, while the memory cell Z2 is arranged on the main surface 2 between two adjacent longitudinal trenches 5. The packing density is increased by means of the height-displaced arrangement of adjacent memory cells, without worsening the insulation between adjacent memory cells.

The programming of the memory cell arrangement ensues through the filling of traps in the gate dielectric 7 by means of the injection of electrons. By this means, the threshold voltage of the programmed MOS transistors is increased. The respective value of the threshold voltage increase can be set during programming via the time and size of the applied voltage.

The programming of the memory cell arrangement can ensue both by means of Fowler-Nordheim tunneling of electrons and through hot electron injection.

For the writing in of the information using Fowler-Nordheim tunneling, the memory cell to be programmed is selected via the associated wordline 9 and bitline. In this embodiment, the MOS transistors connected in series along a row work as a bitline. The bitline of the memory cell is set to a low potential, e.g. 0 volts. In contrast, the associated wordline 9 is set to a high potential, e.g. to $V_{pr}$=12 volts. The other bitlines are raised to a potential $V_{BL}$ that is dimensioned in such a way that $V_{pr}-V_{BL}$ lies significantly beneath the programming voltage $V_{pr}$. The other wordlines 9 are raised to a potential $V_{WL}$ greater than or equal to $V_{BL}+V_T$, whereby $V_T$ signifies the threshold voltage. Since during programming all other bitlines that cross the selected wordline are located at higher potential, the other memory cells, which are connected with the selected wordline, are not programmed. The memory cells are connected in a NAND configuration. They can thereby be connected in such a way that no drain current flows through the memory cells. This has the advantage that the overall programming process runs at very low power.

If the programming ensues by means of hot electron injection, the saturation voltage must be applied to the MOS transistor to be programmed. For this purpose, the bitline allocated to the memory cell is set between ground potential and a high potential, e.g. $V_{BLPr}$=6 volts. The wordline allocated to the memory cell is set to a potential at which the MOS transistor is in saturation operation. The voltage $V_{WLPr}$ on the wordline is smaller than $V_{BLPr}$, e.g. $V_{WLpr}$=4 volts. The other wordlines are set to a high potential that is higher than $V_{BLpr}$ and $V_{WLpr}$, e.g. $V_{WL}$=7 volts. This voltage is selected in dependence on the thickness of the gate dielectric 7 in such a way that no Fowler-Nordheim tunneling arises yet. All other bitlines are set to the same potential at both ends, e.g. to $V_{BL}=V_{WLpr}/2$. A programming of memory cells that lie along the selected wordline on other bitlines is thereby prevented, and a current flow is avoided. Through the saturation operation at high voltage, hot electrons arise in the channel region of the MOS transistor of the selected memory cell, which electrons are partially injected into the gate dielectric 7. The electrons are held by traps in the gate dielectric 7, and increase the threshold voltage of the MOS transistor. In this way, the threshold voltage of the respective MOS transistor is purposively altered according to information to be stored in the respective memory cell.

The memory cell arrangement is produced through depositing of an intermediate oxide, etching of contact holes, and attachment and structuring of a metallic layer. These known process steps are not shown.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. An electrically programmable memory cell arrangement, comprising:

a plurality of individual memory cells in a semiconductor substrate;

the memory cells being arranged in rows that run substantially in parallel;

longitudinal trenches in a main surface of the semiconductor substrate, the trenches running substantially parallel to the rows;

the rows being respectively arranged in alternating fashion on the main surface between adjacent longitudinal trenches and on a bottom of the longitudinal trenches;

insulating structures, the insulating structures insulating adjacent rows against one another, the insulating structures for insulation of adjacent rows having insulating spacers arranged along the side walls of the longitudinal trenches and doped layers arranged respectively between adjacent longitudinal trenches in the semiconductor substrate, which prevent formation of conductive channels in the semiconductor substrate between adjacent rows, the doped layers being formed in the semiconductor substrate that is respectively arranged between neighboring longitudinal trenches, the doped layers having a depth in the semiconductor substrate that is less than a depth of the longitudinal trenches;

the memory cells respectively having at least one MOS transistor;

wordlines running transversely to the rows, the wordlines connected respectively with gate electrodes of MOS transistors arranged along different rows;

the MOS transistors having a gate dielectric made of a material with traps.

2. The memory cell arrangement according to claim 1, wherein:

the MOS transistors of memory cells arranged along a row are connected in series;

source/drain regions connected with one another of MOS transistors adjoining one another along a row are structured as a continuous doped region in the semiconductor substrate;

each row has two terminals between which the MOS transistors arranged in the row are connected in series.

3. The memory cell arrangement according to claim 1, wherein the MOS transistors have as gate dielectric a dielectric multiple layer with at least one layer that has an increased charge bearer capture cross-section in comparison with at least one additional layer.

4. The memory cell arrangement according to claim 3, wherein the layer with increased charge bearer capture cross-section comprises at least one of the materials $Si_3N_4$, $Ta_2O_5$, $Al_2O_3$ or $TiO_2$, and wherein the additional layer comprises at least one of the materials $SiO_2$, $Si_3N_4$ or $Al_2O_3$.

5. The memory cell arrangement according to claim 1, wherein the MOS transistors have as gate dielectric a dielectric layer with stored foreign atoms, whereby the stored foreign atoms have an increased charge bearer capture cross-section in comparison with the dielectric layer.

6. The memory cell arrangement according to claim 5, wherein the dielectric layer comprises $SiO_2$, and wherein the stored foreign atoms contain at least one of the elements W, Pt, Cr, Ni, Pd or Ir.

7. An electrically programmable memory cell arrangement, comprising:

a plurality of individual memory cells in a semiconductor substrate;

the memory cells being arranged in rows that run substantially in parallel;

longitudinal trenches in a main surface of the semiconductor substrate, the trenches running substantially parallel to the rows;

the rows being respectively arranged in alternating fashion on the main surface between adjacent longitudinal trenches and on a bottom of the longitudinal trenches;

insulating structures, the insulating structures insulating adjacent rows against one another, the insulating structures having insulating spacers arranged along the side walls of the longitudinal trenches and doped layers arranged respectively between adjacent longitudinal trenches in the semiconductor substrate, which prevent the formation of conductive channels in the semiconductor substrate between adjacent rows, the doped layers being formed in the semiconductor substrate that is respectively arranged between neighboring longitudinal trenches, the doped layers having a depth in the semiconductor substrate that is less than a depth of the longitudinal trenches;

the memory cells respectively having at least one MOS transistor;

wordlines running transversely to the rows, the wordlines connected respectively with gate electrodes of MOS transistors arranged along different rows;

the MOS transistors having a gate dielectric made of a material with traps, the MOS transistors of memory cells arranged along a row being connected in series;

source/drain regions connected with one another of MOS transistors adjoining one another along a row being structured as a continuous doped region in the semiconductor substrate, and each row having two terminals between which the MOS transistors arranged in the row are connected in series, a doping concentration of the source/drain regions being lower than a doping concentration of the doped layers.

8. The memory cell arrangement according to claim 7, wherein the MOS transistors have as gate dielectric a dielectric multiple layer with at least one layer that has an increased charge bearer capture cross-section in comparison with at least one additional layer.

9. The memory cell arrangement according to claim 8, wherein the layer with increased charge bearer capture cross-section comprises at least one of the materials $Si_3N_4$, $Ta_2O_5$, $Al_2O_3$ or $TiO_2$, and wherein the additional layer comprises at least one of the materials $SiO_2$, $Si_3N_4$ or $Al_2O_3$.

10. The memory cell arrangement according to claim 8, wherein the MOS transistors have as gate dielectric a dielectric layer with stored foreign atoms, whereby the stored foreign atoms have an increased charge bearer capture cross-section in comparison with the dielectric layer.

11. The memory cell arrangement according to claim 10, wherein the dielectric layer comprises $SiO_2$, and wherein the stored foreign atoms contain at least one of the elements W, Pt, Cr, Ni, Pd or Ir.

* * * * *